US012772534B2

(12) United States Patent
Kim et al.

(10) Patent No.: US 12,772,534 B2
(45) Date of Patent: Oct. 20, 2026

(54) SEMICONDUCTOR DEVICE HAVING INTER-POLY OXIDE LAYER BETWEEN GATE POLYSILICON AND SHIELD POLYSILICON AND METHOD OF FORMING A SEMICONDUCTOR DEVICE

(71) Applicant: NEXPERIA B.V., Nijmegen (NL)

(72) Inventors: Hungjin Kim, Nijmegen (NL); Ankit Kumar, Manchester (GB)

(73) Assignee: Nexperia B.V., Nijmegen (NL)

( * ) Notice: Subject to any disclaimer, the term of this patent is extended or adjusted under 35 U.S.C. 154(b) by 383 days.

(21) Appl. No.: 18/476,616

(22) Filed: Sep. 28, 2023

(65) Prior Publication Data

US 2024/0105785 A1 Mar. 28, 2024

(30) Foreign Application Priority Data

Sep. 28, 2022 (EP) .................................... 22198290

(51) Int. Cl.
*H10D 64/01* (2025.01)
*H10D 64/00* (2025.01)

(52) U.S. Cl.
CPC ........... *H10D 64/117* (2025.01); *H10D 64/01* (2025.01)

(58) Field of Classification Search
CPC ............................. H10D 64/117; H10D 64/01
See application file for complete search history.

(56) References Cited

U.S. PATENT DOCUMENTS

2010/0244126 A1* 9/2010 Purtell ................. H10D 30/668 438/270
2015/0295080 A1 10/2015 Lee et al.
2020/0111896 A1* 4/2020 Feil .................... H10D 30/0297
2021/0126124 A1* 4/2021 Hsieh ................... H10D 30/665
2022/0037523 A1* 2/2022 Oda ..................... H10D 64/232
2022/0293786 A1* 9/2022 Hsieh ................... H10D 30/668
2022/0393011 A1* 12/2022 Shin .................. H10D 30/0411

FOREIGN PATENT DOCUMENTS

DE 10 2011 054372 A1 4/2013
WO 2005/065385 A2 7/2005

* cited by examiner

*Primary Examiner* — Michael Jung
(74) *Attorney, Agent, or Firm* — Ruggiero McAllister & McMahon LLC

(57) ABSTRACT

A method of forming a semiconductor device includes: disposing an isolation oxide layer and a shield polysilicon in trenches formed in a substrate, with the shield polysilicon being partially surrounded by the isolation oxide layer; etching the isolation oxide layer; disposing an inter-poly oxide (IPO) layer on an upper surface of the shield polysilicon with the IPO layer laterally surrounded in the trenches by the isolation oxide layer; etching the IPO layer and the isolation oxide layer; lining at least upper sidewalls of the trenches with a gate oxide layer; disposing a gate polysilicon on an upper surface of the IPO layer and on an upper surface of the isolation oxide layer, with the gate polysilicon laterally surrounded by the gate oxide layer; etching the isolation oxide layer so that a thickness of the isolation oxide layer tapers from the shield polysilicon a top opening of the trench.

15 Claims, 8 Drawing Sheets

SEMICONDUCTOR DEVICE HAVING INTER-POLY OXIDE LAYER BETWEEN GATE POLYSILICON AND SHIELD POLYSILICON AND METHOD OF FORMING A SEMICONDUCTOR DEVICE

CROSS-REFERENCE TO RELATED APPLICATIONS

This application claims the benefit under 35 U.S.C. § 119(a) of European Application No. 22198290.3 filed Sep. 28, 2022, the contents of which are incorporated by reference herein in their entirety.

BACKGROUND

1. Field of the Disclosure

The present disclosure generally relates to semiconductor devices. Particular embodiments relate to a method of forming a semiconductor device and to a semiconductor device.

2. Description of the Related Art

An inter-poly oxide layer (sometimes also called an inter-poly dielectric) in a top or split gate structure is used to electrically isolate the gate polysilicon from the source polysilicon (also known as a shield polysilicon) connected to the source electrode. It serves as insulation between the electrodes but it also becomes a part of the gate dielectric and gate charge. Therefore, it is necessary to take into account the profile, thickness and quality of the inter-poly dielectric as well as the cost-effective manufacturability.

DE 10 2011 054372 A1 discloses a process for manufacturing a semiconductor structure having vertical trenches filled with an oxide and etched in order to introduce a gate electrode.

US 2015/295080 A1 discloses a split gate trench field effect transistor including a gate electrode formed in a trench, below which a shield gate is formed, which is surrounded by an insulating structure to float the shield electrode.

WO 2005/065385 A2 discloses various processing steps, including the formation of trenches and dielectric layers inside trenches, as well as reduction of substrate thickness, in the context of power semiconductor devices.

SUMMARY

The formation of such an inter-poly oxide layer in semiconductor devices such as MOSFETs, with a split gate structure is known to suffer from short- or long-term leakage between electrodes caused at weak points where the thickness is thinner, or where the profile is changed with corners. In some cases, bow or warpage may even occur. Also, semiconductor devices' Qgd (gate-drain charge) performance is known to be problematic.

Accordingly, it is an aim of at least some embodiments according to the present disclosure to address some or all of the above-mentioned problems.

Embodiments of the invention are set out in the appended claims.

In a first aspect according to the present disclosure, there is provided a method of forming a semiconductor device. The method comprises the following steps. Forming trenches in a substrate. Disposing an isolation oxide layer in the trenches.

Disposing a shield polysilicon in the trenches, such that the shield polysilicon is partially surrounded by the isolation oxide layer. Etching the isolation oxide layer. Disposing an inter-poly oxide, IPO, layer on an upper surface of the shield polysilicon, such that the IPO layer is laterally surrounded in the trenches by the isolation oxide layer. Etching the IPO layer and the isolation oxide layer. Lining at least upper sidewalls of the trenches with a gate oxide layer. Disposing a gate polysilicon on an upper surface of the IPO layer and on an upper surface of the isolation oxide layer, such that the gate polysilicon is laterally surrounded by the gate oxide layer. The step of etching the IPO layer and the isolation oxide layer and the step of disposing the gate polysilicon are performed such that the contact surface of the gate polysilicon with the IPO layer and the isolation oxide layer is substantially flat.

In some embodiments, the step of etching the isolation oxide layer is performed such that a thickness of the isolation oxide layer tapers from greater thickness near the shield polysilicon to smaller thickness near a top opening of the trench.

In some further developed embodiments, the step of etching the isolation oxide layer is performed such that the thickness of the isolation oxide layer tapers from greater thickness near the shield polysilicon to smaller thickness near a top opening of the trench in such a manner, that the surface of the isolation oxide layer facing towards the center of the trench has a convex shape.

In some embodiments, the step of disposing the IPO layer comprises thermally growing the IPO layer.

In some embodiments, the step of etching the isolation oxide layer is performed at least until mesa of the substrate is exposed.

In some embodiments, the step of etching the isolation oxide layer comprises dry etching.

In some embodiments, the step of etching the IPO layer and the isolation oxide layer comprises dry and wet etching.

In some embodiments, the step of etching the IPO layer and the isolation oxide layer is performed at least until silicon is exposed at upper sidewalls of the trenches.

In some embodiments, the method comprises disposing a photoresist on at most some of the trenches prior to the step of etching the IPO layer and the isolation oxide layer.

In a second aspect according to the present disclosure, there is provided a semiconductor device. The semiconductor device comprises the following elements. A substrate, comprising trenches. An isolation oxide layer, disposed in the trenches. A shield polysilicon, disposed in the trenches and partially surrounded by the isolation oxide layer. An inter-poly oxide, IPO, layer, disposed on an upper surface of the shield polysilicon and laterally surrounded by the isolation oxide layer. A gate oxide layer, lining at least upper sidewalls of the trenches. A gate polysilicon disposed on an upper surface of the IPO layer and on an upper surface of the isolation oxide layer and laterally surrounded in the trenches by the gate oxide layer. The contact surface of the gate polysilicon with the IPO layer and the isolation oxide layer is substantially flat.

In some embodiments, a thickness of the isolation oxide layer tapers from greater thickness near the shield polysilicon to smaller thickness near a top opening of the trench.

In some embodiments, the thickness of the isolation oxide layer tapers from greater thickness near the shield polysilicon to smaller thickness near a top opening of the trench in such a manner, that the surface of the isolation oxide layer facing towards the center of the trench has a convex shape.

In some embodiments, the IPO layer is thermally grown.

BRIEF DESCRIPTION OF DRAWINGS

It will be understood that the above-described embodiments are intended merely to illustrate the principles of the present disclosure, and are not intended to be limiting in any way. The present disclosure will be more fully understood with the help of the following description and the appended drawings, in which.

DETAILED DESCRIPTION

Figure 1:
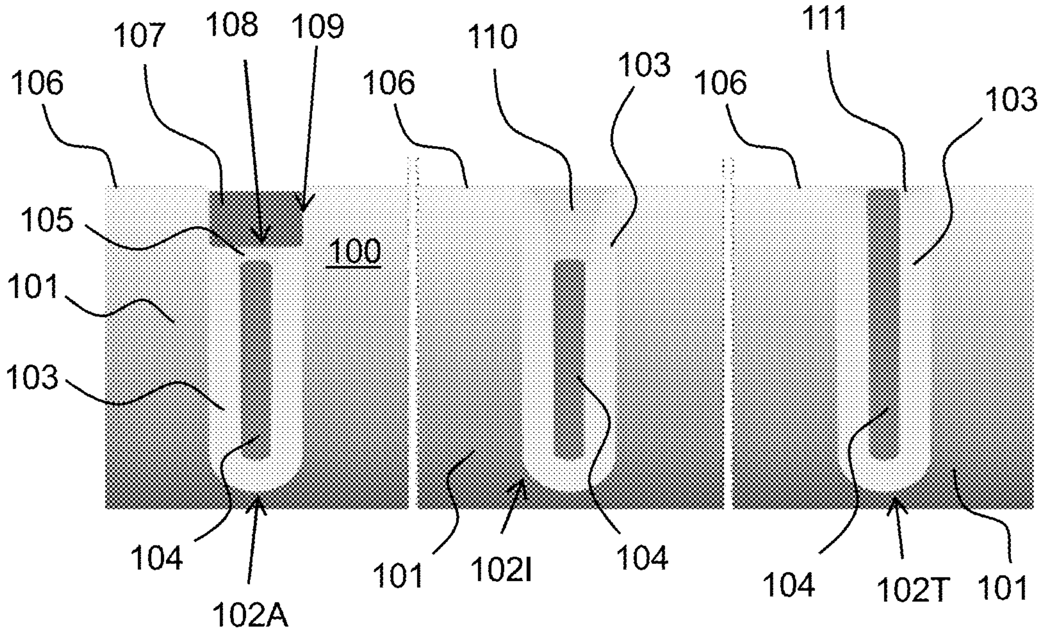
FIG. 1 schematically illustrates a cross section of a semiconductor device embodiment according to the present disclosure, along trenches of the semiconductor device.

As described above, an inter-poly oxide (IPO) layer (sometimes also called an inter-poly dielectric (IPD)) in a top or split gate structure is used to electrically isolate the gate polysilicon from the source polysilicon (also known as a shield polysilicon) connected to the source electrode. It serves as insulation between the electrodes but it also becomes a part of the gate dielectric and gate charge. Therefore, it is necessary to take into account the profile, thickness and quality of the inter-poly dielectric as well as the cost-effective manufacturability.

The formation of such an inter-poly oxide layer in semiconductor devices such as MOSFETs, with a split gate structure is known to suffer from short- or long-term leakage between electrodes caused at weak points where the thickness is thinner, or where the profile is changed with corners. In some cases, bow or warpage may even occur. Also, semiconductor devices' Qgd (gate-drain charge) performance is known to be problematic.

As described above, it is an aim of at least some embodiments according to the present disclosure to address some or all of the above-mentioned problems.

At least some embodiments according to the present disclosure aim to address these some or all of these problems, i.e. they aim to avoid short- or long-term leakage between electrodes caused at weak points where the thickness is thinner and/or where the profile is changed with corners, and/or to improve the device Qgd (gate-drain charge) performance.

Additional advantages of at least some embodiments according to the present disclosure may include the following:

- Reduced area between gate and source polysilicon with sharp corners (low Qgd (gate-drain charge));
- Sufficient IPO/IPD thickness at weak points (leakage);
- Manufacturable for mass production (bow/warpage);
- Flexible application to various Vds (drain-source voltage); and
- Cost-effective In conventionally known approaches of forming IPO (inter-poly oxide)/IPD (inter-poly dielectric), shield oxide (i.e. the isolation oxide layer) is removed completely or mostly, and the trenches are thereafter filled with a very thick oxide, before etching to form the IPO region. This process is expensive and complicated, as a very thick oxide filling is required, which increases throughput time (and thus costs) and which has a high risk of voids, seams and oxide cracks. Also, high-voltage semiconductor devices may suffer from severe risk of bow and warpage using these approaches. Various techniques have been introduced to form more robust IPO, e.g. from thermal oxide to filling the trenches with HDP-oxide (i.e. oxide deposited via high-density plasma chemical vapor deposition) or reflowable oxide like BSG (Boron-Silicate-Glass) and its planarization with CMP (chemical mechanical polishing/planarization) or a dry etch process followed by masked wet etch, etc. However, thermally grown IPO is simpler, but it is difficult to form a sharp gate polysilicon corner, and hence this approach suffers from high Qgd (gate-drain charge) and oxide thinning at gate poly corner.

In contract, in at least some embodiments according to the present disclosure, a spacer shield oxide is formed in order to make a second oxide deposition (i.e. an IPO layer deposition) with reduced risk of cracks, voids or seams. These embodiments may advantageously be applied in power MOSFET technologies, but also in other types of semiconductor devices.

In other words, an oxide layer, functioning as a sort of spacer or shield, is formed at the upper sidewalls of the trench before filling the trench with a preferably thin oxide, thus reducing or even eliminating the risk of any oxide crack or void. The oxide may be deposited with e.g. SACVD (sub-atmospheric chemical vapor deposition) or HDPCVD (high-density plasma chemical vapor deposition). Also, as the spacer oxide may help to make oxide deposition more uniform, so only a comparatively thinner oxide deposition may be needed to reduce or avoid bow/warpage.

FIG. 1 schematically illustrates a cross section of an example of a semiconductor device 100 embodiment according to the present disclosure. The cross section is taken along trenches 102A, 102I, 102T of the semiconductor device 100. For the sake of completeness, not only an active trench 102A (containing both shield polysilicon and gate polysilicon with an inter-poly oxide layer between them) is shown, but also an interim trench 102I (containing shield polysilicon and gate polysilicon) and a termination trench 100T (containing shield polysilicon), in order to better show how the steps of the method according to the present disclosure affect such trenches.

The semiconductor device 100 embodiment according to the present disclosure as shown in FIG. 1 comprises: a substrate 101, comprising trenches 102A;

- an isolation oxide layer 103, disposed in the trenches 102A; a shield polysilicon 104, disposed in the trenches 102A and partially surrounded by the isolation oxide layer 103; an inter-poly oxide, IPO, layer 105, disposed on an upper surface of the shield polysilicon 104 and laterally surrounded by the isolation oxide layer 103;
- a gate oxide layer 106, lining at least upper sidewalls 109 of the trenches 102A; and a gate polysilicon 107 disposed on an upper surface of the IPO layer 105 and on an upper surface of the isolation oxide layer 103 and laterally surrounded in the trenches by the gate oxide layer 106.

The contact surface 108 of the gate polysilicon 107 with the IPO layer 105 and the isolation oxide layer 103 is substantially flat. By having a substantially flat contact surface 108, a sharp (as opposed to rounded) corner can be formed at the lower end of the gate polysilicon 107. This can help reduce Qgd (gate-drain charge) and oxide thinning.

In some embodiments, a thickness of the isolation oxide layer 103 tapers from greater thickness near the shield polysilicon 104 to smaller thickness near a top opening of the trench 102A (i.e. at the top part of the figure as shown).

It is noted that, here too, the thickness of the isolation oxide layer 103 may be measured from the sidewall of the trench 102A in a direction extending radially inward towards the center of the trench 102A and preferably extending perpendicularly from the sidewall of the trench 102A.

In some embodiments, the thickness of the isolation oxide layer 103 tapers from greater thickness near the shield polysilicon 104 to smaller thickness near a top opening of the trench 102A in such a manner, that the surface of the isolation oxide layer 103 facing towards the center of the trench 102A has a convex shape.

In this way, the isolation oxide layer 103 thereby defines a relatively wide aperture near the top opening that is decreasing in circumference more quickly near the top opening and that is decreasing in circumference more gradually near the shield polysilicon 104. This ensures that a spacer oxide can be formed on upper sidewalls 109 of the (active 102A and interim 102I) trenches, to avoid crack, void or seam formation in the oxide, in particular for CVD oxide-filled trenches.

In some embodiments, the IPO layer 105 is thermally grown.

It is noted that the substrate 101 may be a silicon region of a particular conductivity type, depending on the application needs of the semiconductor device 100.

FIGS. 2-7 schematically illustrate various steps of an embodiment according to the present disclosure of a method of forming a semiconductor embodiment.

An exemplary embodiment according to the present disclosure of a method of forming a semiconductor device 100 as shown in FIGS. 2-7 comprises several steps. The method comprises: forming trenches 102A in a substrate 101; disposing an isolation oxide layer 103 in the trenches; disposing a shield polysilicon 104 in the trenches, such that the shield polysilicon is partially surrounded by the isolation oxide layer; etching the isolation oxide layer 103; disposing an inter-poly oxide, IPO, layer 105 on an upper surface of the shield polysilicon, such that the IPO layer is laterally surrounded in the trenches by the isolation oxide layer; etching the IPO layer 105 and the isolation oxide layer 103; lining at least upper sidewalls 109 of the trenches with a gate oxide layer 106; and disposing a gate polysilicon 107 on an upper surface of the IPO layer 105 and on an upper surface of the isolation oxide layer 103, such that the gate polysilicon 107 is laterally surrounded by the gate oxide layer 106; The step of etching the IPO layer 105 and the isolation oxide layer 103 and the step of disposing the gate polysilicon 107 are performed such that the contact surface 108 of the gate polysilicon 107 with the IPO layer 105 and the isolation oxide layer 103 is substantially flat.

In this manner, a sharp (as opposed to rounded) corner can be formed at the lower end of the gate polysilicon 107. This can help reduce Qgd (gate-drain charge) and oxide thinning.

In an exemplary embodiment, the step of etching the isolation oxide layer 103 is performed such that a thickness of the isolation oxide layer 103 tapers from greater thickness near the shield polysilicon 104 to smaller thickness near a top opening of the trench 102A.

This ensures that a spacer oxide is present on upper sidewalls 109 of the (active 102A and interim 102I) trenches before filling the trenches 102A, 102I with a thin oxide (either by SACVD (sub-atmospheric chemical vapor deposition) or HDPCVD (high-density plasma chemical vapor deposition)), to avoid crack, void or seam formation in the oxide, in particular for CVD oxide-filled trenches. As the spacer oxide helps to make oxide deposition more uniform, comparatively thinner oxide deposition will be needed to avoid bow or warpage.

It is noted that the thickness of the isolation oxide layer 103 may be measured from the sidewall of the trench 102A in a direction extending radially inward towards the center of the trench 102A.

In some embodiments, the step of etching the isolation oxide layer 103 is performed such that the thickness of the isolation oxide layer 103 tapers from greater thickness near the shield polysilicon 104 to smaller thickness near a top opening of the trench 102A in such a manner, that the surface of the isolation oxide layer 103 facing towards the center of the trench 102A has a convex (i.e. externally rounded) shape.

In this way, the isolation oxide layer 103 thereby defines a relatively wide aperture near the top opening that is decreasing in circumference more quickly near the top opening and that is decreasing in circumference more gradually near the shield polysilicon 104.

It is noted for various embodiments according to the present disclosure, that the surface 108 being substantially flat may be taken to mean that the angle defined by the upper sidewalls 109 of the trenches 102A on the one hand and the surface 108 is preferably close to 90 degrees. In other words, there may be a negligible rounding at the sharp point of the corner, but overall the angle is preferably a right angle. From another point of view, the surface 108 being substantially flat may be taken to mean that the surface 108 has a very low curvature (measured along a diameter of the surface 108), e.g. of less than 5 degrees, e.g. preferably less than 1 degree, over most, e.g. at least 90 percent, preferably at least 99 percent of its area.

In some embodiments, the step of disposing the IPO layer 105 comprises thermally growing the IPO layer 105.

In some embodiments, the step of etching the isolation oxide layer 103 is performed at least until mesa of the substrate 101 is exposed.

In some embodiments, the step of etching the isolation oxide layer 103 comprises dry etching.

In some embodiments, the step of etching the IPO layer 105 and the isolation oxide layer 103 comprises dry and wet etching.

In some embodiments, the step of etching the IPO layer 105 and the isolation oxide layer 103 is performed at least until silicon is exposed at upper sidewalls 109 of the trenches 102A. This may help to leave an oxide layer in the trench 102A.

In some embodiments, the method comprises: disposing a photoresist 112 on at most some of the trenches 102I, 102T prior to the step of etching the IPO layer 105 and the isolation oxide layer 103.

Figure 2:
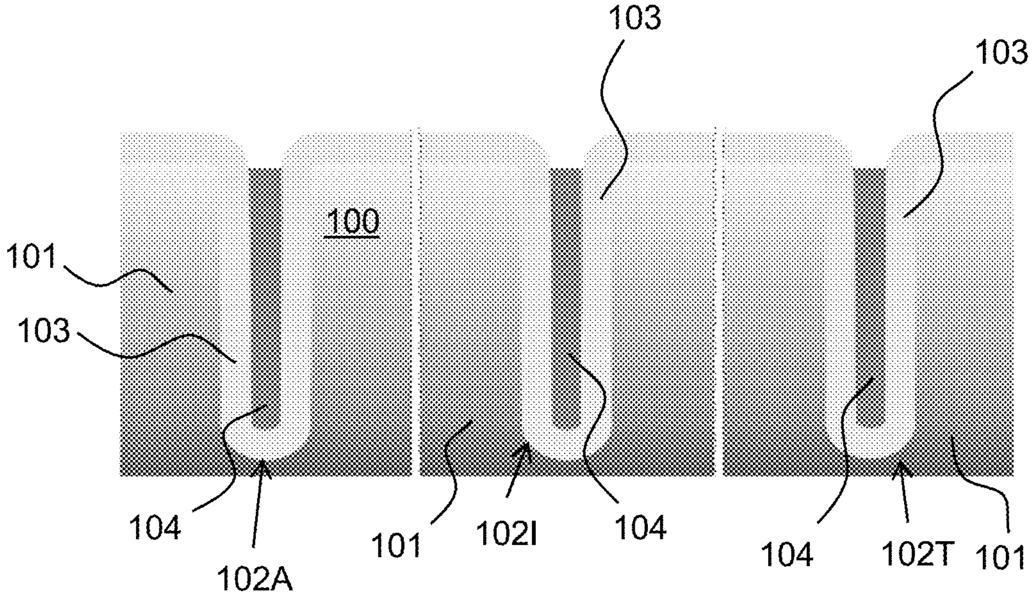
FIGS. 2, 3, 4, 5, 6 and 7 schematically illustrate various steps of an embodiment according to the present disclosure of a method of forming a semiconductor embodiment.

FIG. 2 schematically shows a first stage of an exemplary method of forming a semiconductor device 100 according to the present disclosure.

The semiconductor device 100 may subsequently be subjected to a blanket shield polysilicon etch. This process may include the following steps:

Etching the shield polysilicon 104 after CMP (chemical-mechanical polishing/planarization). Advantageously, the shield polysilicon 104 is levelled to mesa surface of the device.

By doing this, any residual polysilicon 104 on the wafer after the CMP can be removed.

Advantageously, the recessed depth of the shield polysilicon 104 from the top opening of the trenches 102A, 102I may be carefully chosen to obtain the desired shield oxide profile in wet etching.

Figure 3:
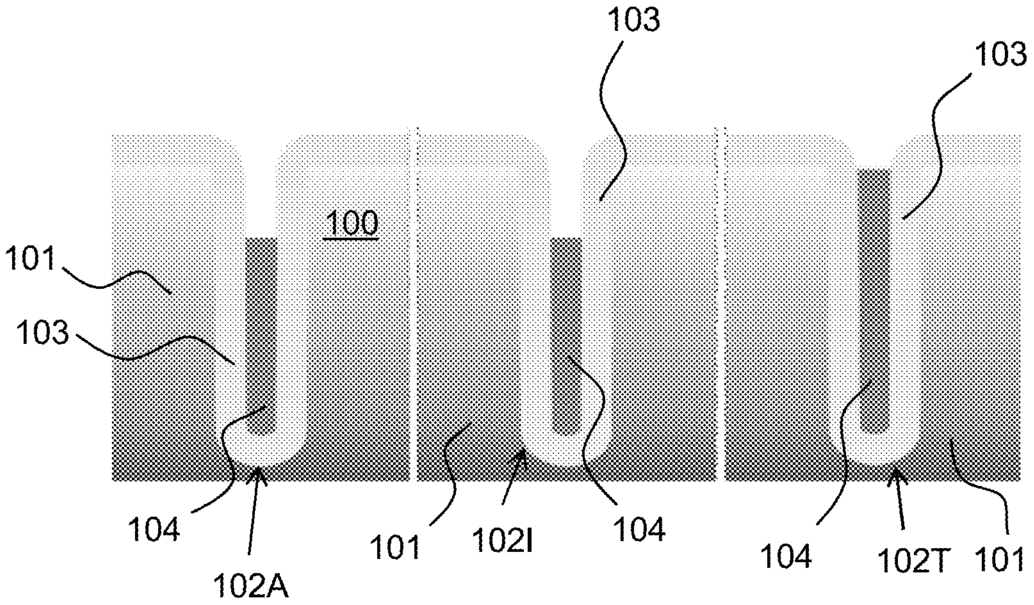

FIG. 3 schematically shows a second stage of an exemplary method of forming a semiconductor device 100 according to the present disclosure.

The semiconductor device 100 may subsequently be subjected to a Litho, SD-Poly etch and PR strip. This process may include the following steps:

Preferably isotropic dry etching to obtain the desired depth for a rounded polysilicon profile in the active 102A and interim 102I trenches.

Photoresist removal and/or by-product removal, preferably with a plasma strip process and a wet strip process.

Advantageously, the recessed depth may be carefully chosen to obtain the desired gate length.

The semiconductor device 100 may subsequently be subjected to an oxide etch. This process may include the following steps:

Dry etching the oxide till mesa is exposed.

This will form a spacer oxide on active and interim trench sidewall.

This will help to avoid any void/seam formation for CVD oxide filled trench.

In a preferred embodiment, the step of etching the isolation oxide layer 103 may preferably be performed such that a thickness of the isolation oxide layer 103 tapers 113 from greater thickness near the shield polysilicon 104 to smaller thickness near a top opening of the trench 102A, 102I. In a further developed embodiment, this may be performed in such a manner, that the surface 113 of the isolation oxide layer 103 facing towards the center of the trench 102A, 102I has a convex shape. This tapered surface 113 with a preferably convex shape helps to ensure that an adequate volume of isolation oxide layer 103 is present, functioning as a spacer, such that the IPO layer 105 does not need to be very thick but can be relatively thin.

Figure 4:
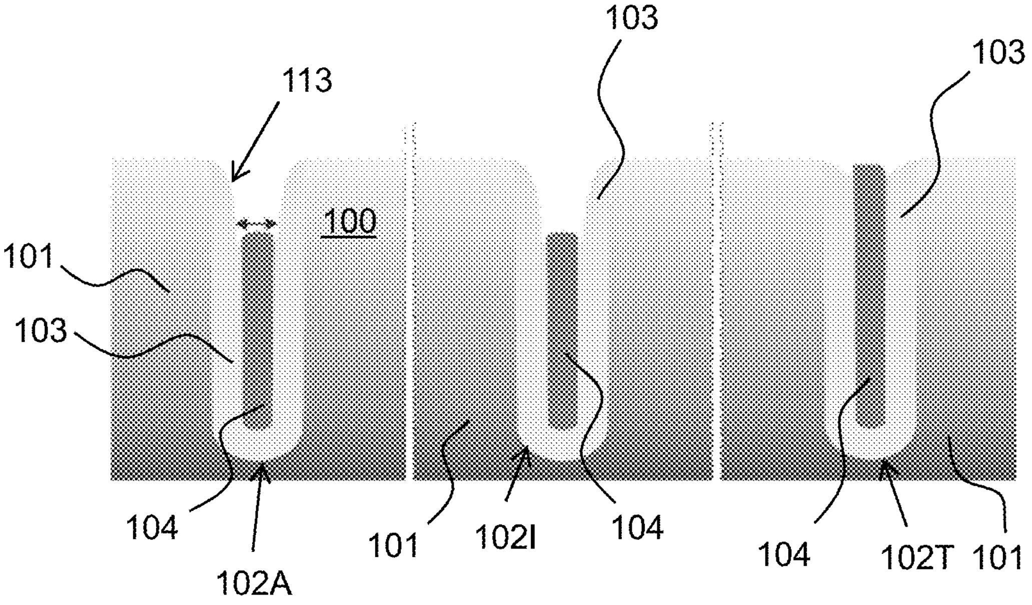

FIG. 4 schematically shows a third stage of an exemplary method of forming a semiconductor device 100 according to the present disclosure.

The semiconductor device 100 may subsequently be subjected to an oxide deposition and to etching it back. This process may include the following steps:

Oxide 105, 110, 111 may be deposited, preferably filling the trenches 102A, 102I, 102T. In this stage, the active trenches 102A and interim trenches 102I are filled in a similar manner, whereas the termination trenches 102T that have a relatively greater volume of shield polysilicon 104 may be filled with a correspondingly smaller volume of oxide. This oxide will of course become an inter-poly oxide (IPO) layer 105 for the active trenches 102A as soon as a gate oxide layer is added ("inter-poly" meaning between oxides). For the intermediate trenches 102I, the oxide layer 110 may not become an IPO layer by e.g. interposing a suitable photoresist, as will be described below. For the termination trenches 102T, the oxide layer 111 may also not become an IPO layer. In some embodiments, there may be none or hardly any oxide present atop the shield polysilicon 104 in the termination trenches 102T.

The deposited oxide layer 105, 110, 111 may optionally be densified and may preferably be planarized, e.g. by CMP and etching it back to the desired level.

The interim trenches 102I may be filled with oxide 110 and may not be electrically connected.

Figure 5:
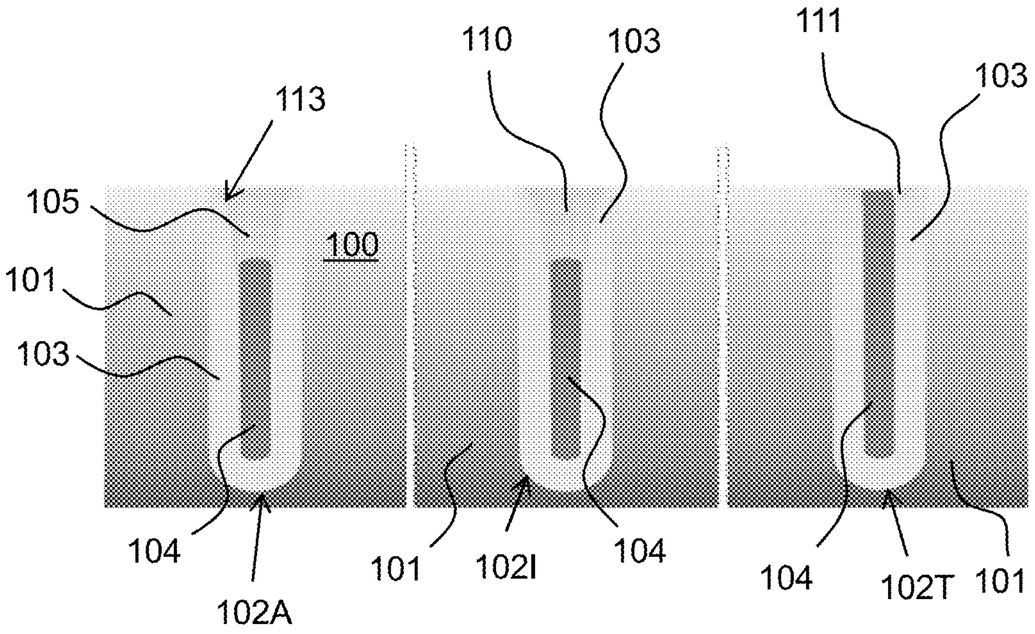

FIG. 5 schematically shows a fourth stage of an exemplary method of forming a semiconductor device 100 according to the present disclosure.

The semiconductor device 100 may subsequently be subjected to a litho, oxide etch. This process may include the following steps:

A photoresist 112, preferably a wet photoresist, may be disposed on the interim 102I and termination 102T trenches.

Oxide in the open area (i.e. the area not covered by the photoresist 112) may be dry and wet etched until silicon is exposed and the desired length of the exposed silicon from the surface is achieved.

The step of etching the IPO layer 105 and the isolation oxide layer 103 and the step of disposing the gate polysilicon 107 are preferably performed such that the contact surface 108 of the gate polysilicon 107 with the IPO layer 105 and the isolation oxide layer 103 is substantially flat.

Figure 6:
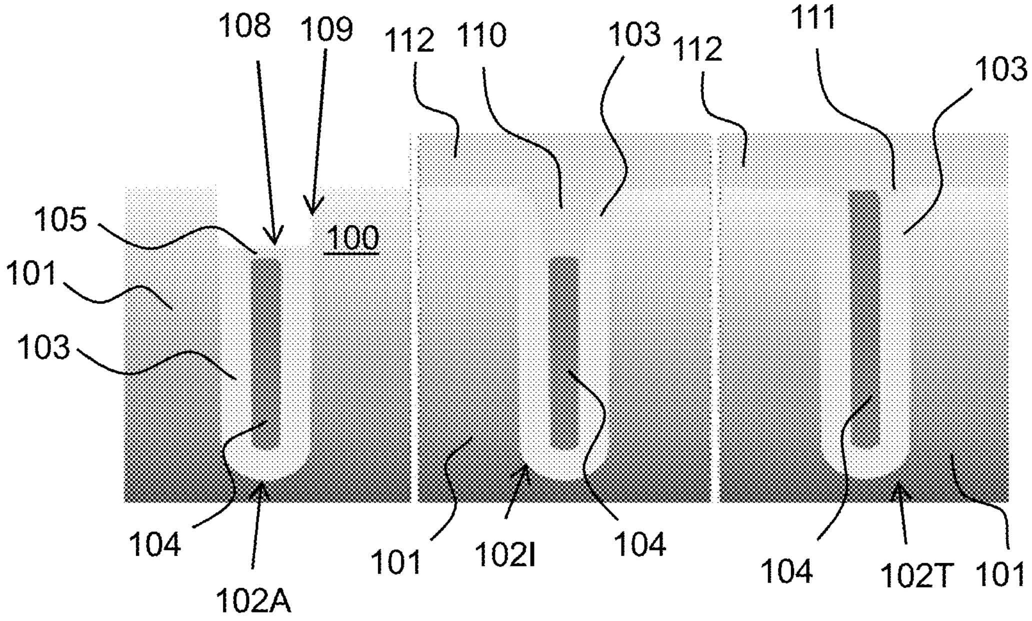

FIG. 6 schematically shows a fifth stage of an exemplary method of forming a semiconductor device 100 according to the present disclosure.

The semiconductor device 100 may subsequently be subjected to removal of the photoresist 112 once the above-described etch process is complete.

Figure 7:
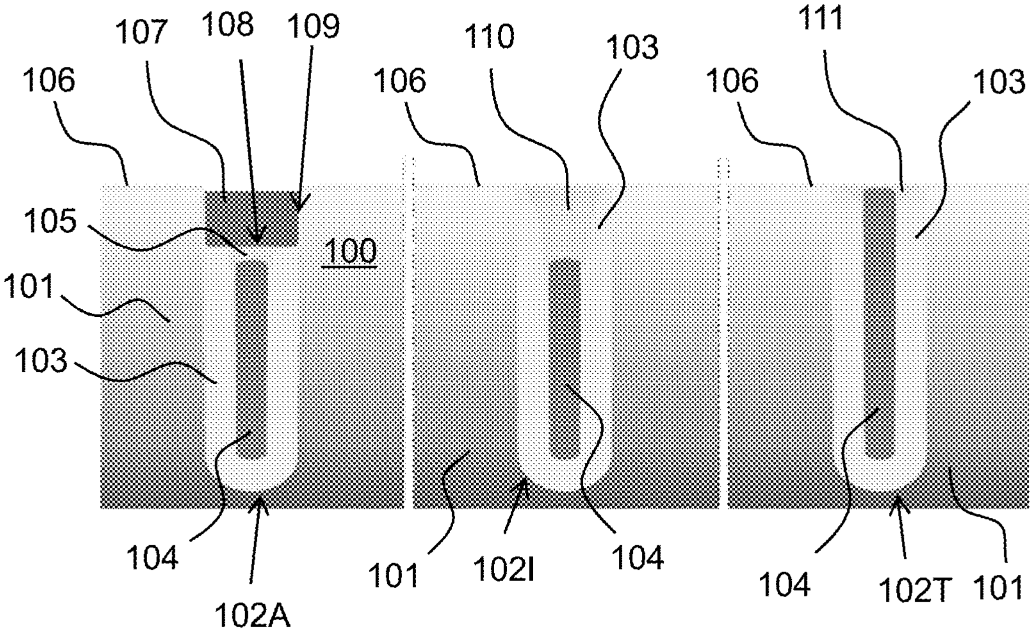

FIG. 7 schematically shows a sixth stage of an exemplary method of forming a semiconductor device according to the present disclosure. In particular, it shows the formation of a gate oxide and a gate polysilicon (i.e. an electrode). This process may include the following steps:

Gate oxidation comprised with either dry or wet oxidation or a combination of wet+dry oxidation for better oxide quality. IPO is formed at this step together with gate oxide.

Gate poly silicon is deposited and planarized with CMP process.

There may be thin poly silicon residue from small topology, so gate poly is lightly dry etched to removed it.

Figure 8:
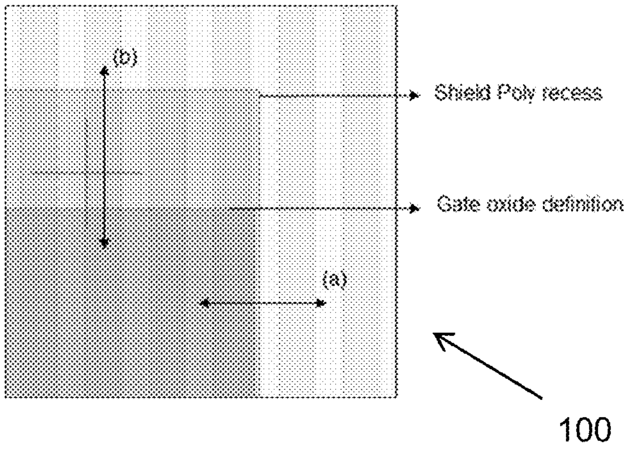
FIG. 8 schematically illustrates a top layout of a semiconductor device embodiment according to the present disclosure.

FIG. 8 schematically illustrates a top layout of a semiconductor device embodiment 100 according to the present disclosure. The figure shows a part of design where a shield polysilicon profile changes inside a trench. The shield polysilicon is recessed in the area indicated with "Shield Poly recess", in order to allow gate polysilicon to be filled in, and a thin gate oxide layer is formed in the area indicated with "Gate oxide definition".

While the invention has been described by way of example and in terms of the preferred embodiments, it should be understood that the invention is not limited to the disclosed embodiments. On the contrary, it is intended to cover various modifications and similar arrangements (as would be apparent to the skilled person). Therefore, the scope of the appended claims should be accorded the broadest interpretation so as to encompass all such modifications and similar arrangements.

LIST OF ELEMENTS IN THE DRAWINGS

100 semiconductor device
101 substrate
102A trench (active)
102I trench (interim)
102T trench (termination)
103 isolation oxide layer
104 shield polysilicon
105 inter-poly oxide layer (IPO layer)
106 gate oxide layer
107 gate polysilicon
108 surface/contact surface
109 upper sidewalls

110 oxide in interim trench
111 oxide in termination trench
112 photoresist
113 tapered surface

What is claimed is:

1. A semiconductor device, further comprising:
a substrate comprising trenches;
an isolation oxide layer disposed in the trenches;
a shield polysilicon disposed in the trenches and partially surrounded by the isolation oxide layer;
an inter-poly oxide (IPO) layer disposed on an upper surface of the shield polysilicon and laterally surrounded by the isolation oxide layer;
a gate oxide layer lining at least upper sidewalls of the trenches; and
a gate polysilicon disposed on an upper surface of the IPO layer and on an upper surface of the isolation oxide layer and laterally surrounded in the trenches by the gate oxide layer;
wherein the contact surface of the gate polysilicon with the IPO layer and the isolation oxide layer is substantially flat; and
wherein the isolation oxide layer has a thickness that tapers from a greater thickness near the shield polysilicon to a smaller thickness near a top opening of the trench so that a surface of the isolation oxide layer facing towards the center of the trench has a convex shape.

2. A method of forming a semiconductor device, the method comprising:
forming trenches in a substrate;
disposing an isolation oxide layer in the trenches;
disposing a shield polysilicon in the trenches so that the shield polysilicon is partially surrounded by the isolation oxide layer;
etching the isolation oxide layer;
disposing an inter-poly oxide (IPO) layer on an upper surface of the shield polysilicon so that the IPO layer is laterally surrounded in the trenches by the isolation oxide layer;
etching the IPO layer and the isolation oxide layer;
lining at least upper sidewalls of the trenches with a gate oxide layer; and
disposing a gate polysilicon on an upper surface of the IPO layer and on an upper surface of the isolation oxide layer, so that the gate polysilicon is laterally surrounded by the gate oxide layer;
wherein the step of etching the IPO layer and the isolation oxide layer and the step of disposing the gate polysilicon are performed so that the contact surface of the gate polysilicon with the IPO layer and the isolation oxide layer is substantially flat, and the contact surface has a curvature measured along a diameter of the contact surface of less than 5 degrees of its area;
wherein the step of etching the isolation oxide layer is performed so that a thickness of the isolation oxide layer tapers from a greater thickness near the shield polysilicon to a smaller thickness near a top opening of the trench so that the surface of the isolation oxide layer facing towards the center of the trench has a convex shape; and
wherein the step of etching the IPO layer and the isolation oxide layer is performed at least until silicon is exposed at upper sidewalls of the trenches.

3. The method according to claim 2, wherein the step of disposing the IPO layer comprises thermally growing the IPO layer.

4. The method according to claim 3, wherein the step of etching the IPO layer and the isolation oxide layer comprises dry and wet etching.

5. The method according to claim 3, further comprising disposing a photoresist on at most some of the trenches prior to the step of etching the IPO layer and the isolation oxide layer.

6. The method according to claim 2, wherein the step of etching the isolation oxide layer is performed at least until a mesa of the substrate is exposed.

7. The method according to claim 6, wherein the step of etching the isolation oxide layer comprises dry etching.

8. The method according to claim 6, wherein the step of etching the IPO layer and the isolation oxide layer comprises dry and wet etching.

9. The method according to claim 6, further comprising disposing a photoresist on at most some of the trenches prior to the step of etching the IPO layer and the isolation oxide layer.

10. The method according to claim 2, wherein the step of etching the isolation oxide layer comprises dry etching.

11. The method according to claim 2, wherein the step of etching the IPO layer and the isolation oxide layer comprises dry and wet etching.

12. The method according to claim 2, further comprising disposing a photoresist on at most some of the trenches prior to the step of etching the IPO layer and the isolation oxide layer.

13. The method according to claim 2, wherein the step of disposing the IPO layer comprises thermally growing the IPO layer.

14. The method according to claim 2, wherein the step of etching the isolation oxide layer is performed at least until a mesa of the substrate is exposed.

15. The method according to claim 2, wherein the step of etching the isolation oxide layer comprises dry etching.

* * * * *